(12) United States Patent
Nakano et al.

(10) Patent No.: US 12,011,738 B2
(45) Date of Patent: Jun. 18, 2024

(54) SUBSTRATE PROCESSING METHOD AND IONIC LIQUID

(71) Applicant: TOKYO ELECTRON LIMITED, Tokyo (JP)

(72) Inventors: Takeo Nakano, Nirasaki (JP); Hirokazu Ueda, Osaka (JP); Mitsuaki Iwashita, Nirasaki (JP); Naoki Umeshita, Tokyo (JP); Ryuichi Asako, Nirasaki (JP); Kenichi Uki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/096,537

(22) Filed: Jan. 12, 2023

(65) Prior Publication Data

US 2023/0226571 A1  Jul. 20, 2023

(30) Foreign Application Priority Data

Jan. 19, 2022 (JP) .................................. 2022-006659

(51) Int. Cl.
  *B05D 7/24* (2006.01)
  *B05D 1/02* (2006.01)
(52) U.S. Cl.
  CPC ............... *B05D 7/24* (2013.01); *B05D 1/025* (2013.01); *B05D 2506/10* (2013.01)

(58) Field of Classification Search
  CPC .................................. B05D 1/025; B05D 7/24
  See application file for complete search history.

(56) References Cited

U.S. PATENT DOCUMENTS

| | | | |
|---|---|---|---|
| 2008/0138700 A1* | 6/2008 | Horpel | H01M 50/44 429/129 |
| 2009/0163394 A1* | 6/2009 | Muraishi | C07F 9/65688 252/364 |
| 2019/0276698 A1* | 9/2019 | Dazai | B05D 5/00 |

FOREIGN PATENT DOCUMENTS

| | | |
|---|---|---|
| KR | 1020020082781 A | 10/2002 |
| WO | 2016/117656 A1 | 7/2016 |
| WO | 2017150038 A1 | 9/2017 |

* cited by examiner

*Primary Examiner* — Dah-Wei D. Yuan
*Assistant Examiner* — Kristen A Dagenais
(74) *Attorney, Agent, or Firm* — Nath, Goldberg & Meyer; Jerald L. Meyer; Tanya E. Harkins

(57) ABSTRACT

A substrate processing method includes forming a film of an ionic liquid on a surface of a substrate, on which a pattern is formed, by supplying the ionic liquid to the surface of the substrate, wherein the ionic liquid has a cation containing a hydrocarbon chain having six or more carbon atoms, and wherein at least one hydrogen atom in the hydrocarbon chain is substituted with a fluorine atom.

18 Claims, 10 Drawing Sheets

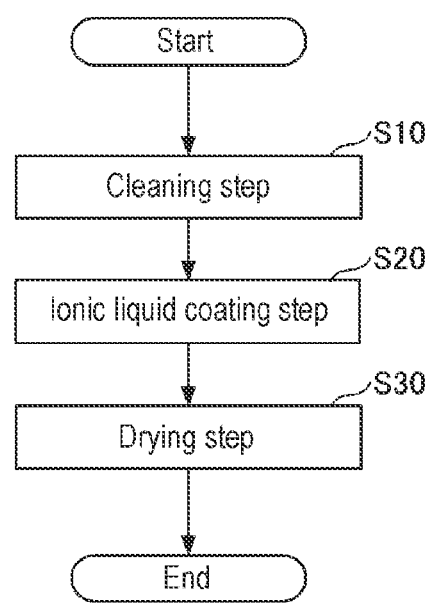

Ionic liquid A1

Ionic liquid B1

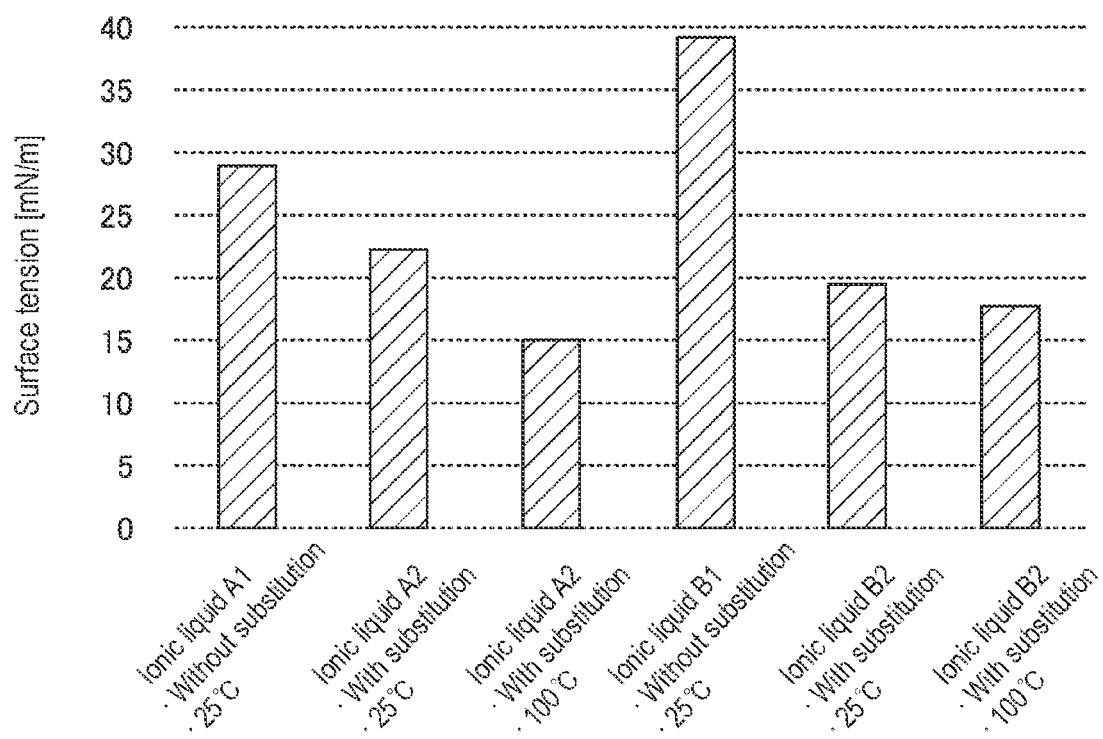

SUBSTRATE PROCESSING METHOD AND IONIC LIQUID

CROSS-REFERENCE TO RELATED APPLICATION

This application is based upon and claims the benefit of priority from Japanese Patent Application No. 2022-006659, filed on Jan. 19, 2022, the entire contents of which are incorporated herein by reference.

TECHNICAL FIELD

The present disclosure relates to a substrate processing method and an ionic liquid.

BACKGROUND

A technique is known in which a liquid film of isopropyl alcohol (IPA) as an anti-drying liquid is formed on a surface of a substrate having a pattern formed thereon, and then the substrate is subjected to a supercritical process (e.g., see Patent Document 1).

PRIOR ART DOCUMENTS

Patent Documents

International Publication No. 2017/150038

SUMMARY

Some embodiments of the present disclosure provide a substrate processing method including forming a film of an ionic liquid on a surface of a substrate, on which a pattern is formed, by supplying the ionic liquid to the surface of the substrate, wherein the ionic liquid has a cation containing a hydrocarbon chain having six or more carbon atoms, and wherein at least one hydrogen atom in the hydrocarbon chain is substituted with a fluorine atom BRIEF DESCRIPTION OF DRAWINGS The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart illustrating a substrate processing method according to an embodiment.

FIG. 10 is a diagram illustrating analysis results of surface tensions of ionic liquids.

DETAILED DESCRIPTION

Figure 2A:
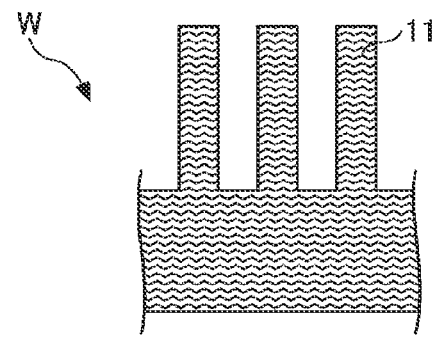
FIGS. 2A to 2C are cross-sectional views illustrating the substrate processing method according to the embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will be described with reference to the accompanying drawings. In all the accompanying drawings, the same or corresponding members or components will be denoted by the same or corresponding reference numerals, and redundant descriptions thereof will be omitted.

[Substrate Processing Method]

A substrate processing method according to an embodiment will be described with reference to FIGS. 1 and 2A to 2C. As illustrated in FIG. 1, the substrate processing method according to the embodiment includes a cleaning step S10, an ionic liquid coating step S20, and a drying step S30.

The cleaning step S10 includes cleaning a surface of a substrate W by supplying a chemical liquid and a rinsing liquid to the surface of the substrate W, on which a pattern 11 is formed, in a predetermined order (see FIG. 2A). The substrate W is, for example, a semiconductor wafer. The chemical liquid contains an SC1 liquid (mixed liquid of ammonia and hydrogen peroxide solution) which is an alkaline chemical liquid. Supplying the SC1 liquid to the surface of the substrate W may remove particles or organic contaminants adhered to the surface of the substrate W. The chemical liquid may contain a dilute hydrofluoric acid aqueous solution (DHF) which is an acidic chemical liquid. Supplying the DHF to the surface of the substrate W may remove a native oxide film formed on the surface of the substrate W.

The rinsing liquid contains deionized water (DIW). An example of the cleaning step S10 includes performing removal of particles or organic contaminants with the SC1 solution, rinse cleaning with the DIW, removal of a native oxide film with the DHF, and rinse cleaning with the DIW in this order. However, the cleaning step S10 is not limited thereto.

Figure 2B:
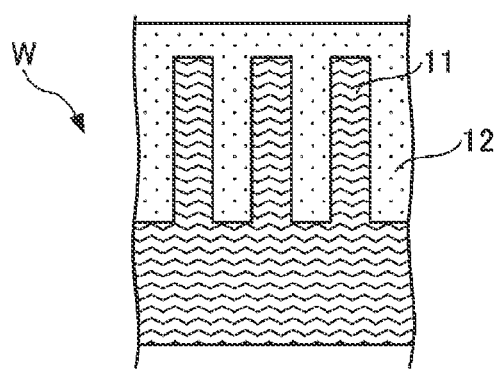

The ionic liquid coating step S20 includes forming a film 12 of an ionic liquid on the surface of the substrate W by supplying the ionic liquid to the surface of the substrate W having the cleaned surface (see FIG. 2B). The ionic liquid is solidified on the surface of the substrate W and also enters the pattern 11 formed on the surface of the substrate W, thereby forming the ionic liquid film 12.

The ionic liquid has cations and anions.

The cation may contain a hydrocarbon chain having six or more carbon atoms (hereinafter also referred to as "first hydrocarbon chain"), at least one hydrogen (H) atom in the first hydrocarbon chain being substituted with a fluorine (F) atom. Since the fluorine atom has a larger atomic radius than the hydrogen atom, a CF group has a larger excluded volume than a CH group. Therefore, an ionic liquid having a cation, in which at least one hydrogen atom in a hydrocarbon chain is substituted with a fluorine atom, has a lower density than an ionic liquid having a cation in which a hydrogen atom in a hydrocarbon chain is not substituted with a fluorine atom. Thus, an intermolecular force between molecules that make up the ionic liquid is reduced, which results in a reduced surface tension of the ionic liquid. As a result, when the substrate W is dried in the drying step S30 to remove the ionic liquid film 12 formed on the surface of the substrate W, it is possible to prevent a pattern collapse by which adjacent patterns 11 overlap each other.

In the first hydrocarbon chain, all hydrogen atoms bonded to a carbon (C) atom located at a distal end may be substituted with fluorine atoms. Even when substituted with a CF group, the CH group located at the distal end becomes non-polar. Thus, the intermolecular force between adjacent molecules is reduced, which may further reduce the surface tension of the ionic liquid. In this case, in the first hydrocarbon chain, all hydrogen atoms bonded to a carbon atom located closer to a proximal end than the carbon atom located at the distal end may or may not be substituted with fluorine atoms. From the viewpoint of having a lower density, in some embodiments, all hydrogen atoms in the first hydrocarbon chain may be substituted with fluorine atoms.

The cation may contain another hydrocarbon chain in addition to the first hydrocarbon chain. In the other hydrocarbon chain, from the viewpoint of lowering the surface tension, at least one hydrogen atom may be substituted with a fluorine atom, and in some embodiments, all hydrogen atoms may be substituted with fluorine atoms, as in the first hydrocarbon chain.

A central element of the cation may be, for example, nitrogen (N), phosphorus (P), aluminum (Al), or gallium (Ga).

The anion is not particularly limited, but may contain, for example, a hydrocarbon chain (hereinafter also referred to as "second hydrocarbon chain"). In this case, in the second hydrocarbon chain, from the viewpoint of lowering the surface tension, at least one hydrogen atom may be substituted with a fluorine atom, and in some embodiments, all hydrogen atoms may be substituted with fluorine atoms, as in the first hydrocarbon chain.

The ionic liquid desirably has a surface tension of 30 mN/m or less at 25 degrees C. and more desirably has a surface tension of 20 mN/m or less at 25 degrees C. This makes it easier for the ionic liquid to enter the pattern 11.

The ionic liquid may be BHDP(tributyl(hexadecyl)phosphonium)-DSS(2,2-dimethyl-2-silapentane-5-sulfonate), BDDP(tributyl(dodecyl)phosphonium)-DSS, and BHDA(tributyl(hexadecyl)ammonium)-DSS, in which at least one hydrogen atom in a hydrocarbon chain is substituted with a fluorine atom. The ionic liquid may be obtained by substituting at least one hydrogen atom in a hydrocarbon chain of an ionic liquid, in which phosphorus (P) as a central element of a cation (BHDP) of BHDP-DSS is substituted with aluminum (Al) or gallium (Ga), with a fluorine atom. However, the ionic liquid is not limited thereto.

Figure 2C:
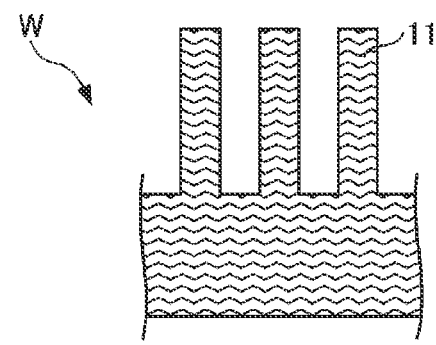

The drying step S30 includes drying and removing the ionic liquid film 12 formed on the surface of the substrate W (see FIG. 2C). The drying step S30 includes performing a supercritical processing on the substrate W having the ionic liquid film 12 formed thereon.

In the supercritical processing, the substrate W is accommodated within a processing container, and then supercritical $CO_2$, which was heated and pressurized to 31 degrees C. and 7.5 MPa or higher, is introduced into the processing container at a predetermined flow rate. At this time, the ionic liquid film 12 solidified on the surface of the substrate W is brought into contact with and extracted into the supercritical $CO_2$ on the surface of the substrate, so that the ionic liquid film 12 is removed from the surface of the substrate W. Further, the supercritical $CO_2$ enters the pattern 11 formed on the surface of the substrate W over time, and extracts and removes the ionic liquid film 12 in the pattern 11. As a result, the ionic liquid film 12 filling the pattern 11 is substituted with the supercritical $CO_2$, and is removed from the surface of the substrate W.

However, in a case where the ionic liquid on the surface of the substrate W is not sufficiently substituted with the supercritical $CO_2$, if the surface tension of the ionic liquid film 12 is high, the pattern 11 may sometimes collapse when the surface tension of the ionic liquid film 12 remaining in the pattern 11 acts on the pattern 11. In contrast, according to the embodiment, the ionic liquid has the cation that contains a hydrocarbon chain having six or more carbon atoms, and at least one hydrogen atom in the hydrocarbon chain is substituted with a fluorine atom. Thus, the ionic liquid has a reduced surface tension, so that the pattern collapse may be prevented even when the ionic liquid film 12 remains in the pattern 11.

In addition, in the drying step S30, the ionic liquid film 12 on the surface of the substrate W may be peeled off and removed by performing a physical operation on the substrate W instead of the supercritical processing. The physical operation may include, for example, horizontal movement, rotation, and tilting of the substrate W. Further, the ionic liquid may be subjected to a phase transition to reduce a viscosity of the ionic liquid film 12.

As described above, the substrate processing method according to the embodiment includes the ionic liquid coating step S20 of forming the ionic liquid film 12 on the surface of the substrate W by supplying an ionic liquid to the surface of the substrate W having the pattern 11 formed thereon. The ionic liquid used in the ionic liquid coating step S20 has a cation containing a hydrocarbon chain having six or more carbon atoms, and at least one hydrogen atom in the hydrocarbon chain is substituted with a fluorine atom.

Since the fluorine (F) atom has a larger atomic radius than the hydrogen (H) atom, a CF group has a larger excluded volume than a CH group. Therefore, an ionic liquid having a cation in which at least one hydrogen atom in a hydrocarbon chain is substituted with a fluorine atom has a lower density than an ionic liquid having a cation in which a hydrogen atom in a hydrocarbon chain is not substituted with a fluorine atom. Thus, the intermolecular force between molecules that make up the ionic liquid is reduced, which results in a reduced surface tension of the ionic liquid. As a result, when the substrate W is dried to remove the ionic liquid film 12 formed on the surface of the substrate W, it is possible to prevent pattern collapse by which adjacent patterns overlap each other.

Further, with the substrate processing method according to the embodiment, the substrate W is dried using an ionic liquid instead of isopropyl alcohol (IPA), after the cleaning step S10. Since the ionic liquid may be used even at high temperatures, much less amount of water is introduced compared with IPA. Therefore, pattern collapse is less likely to occur. Further, since the ionic liquid does not evaporate, condensation due to evaporation as in IPA may be prevented. Further, since the ionic liquid is a conductive liquid, static electricity on the substrate W may be removed by the ionic liquid.

[Cleaning Device]

Figure 3:
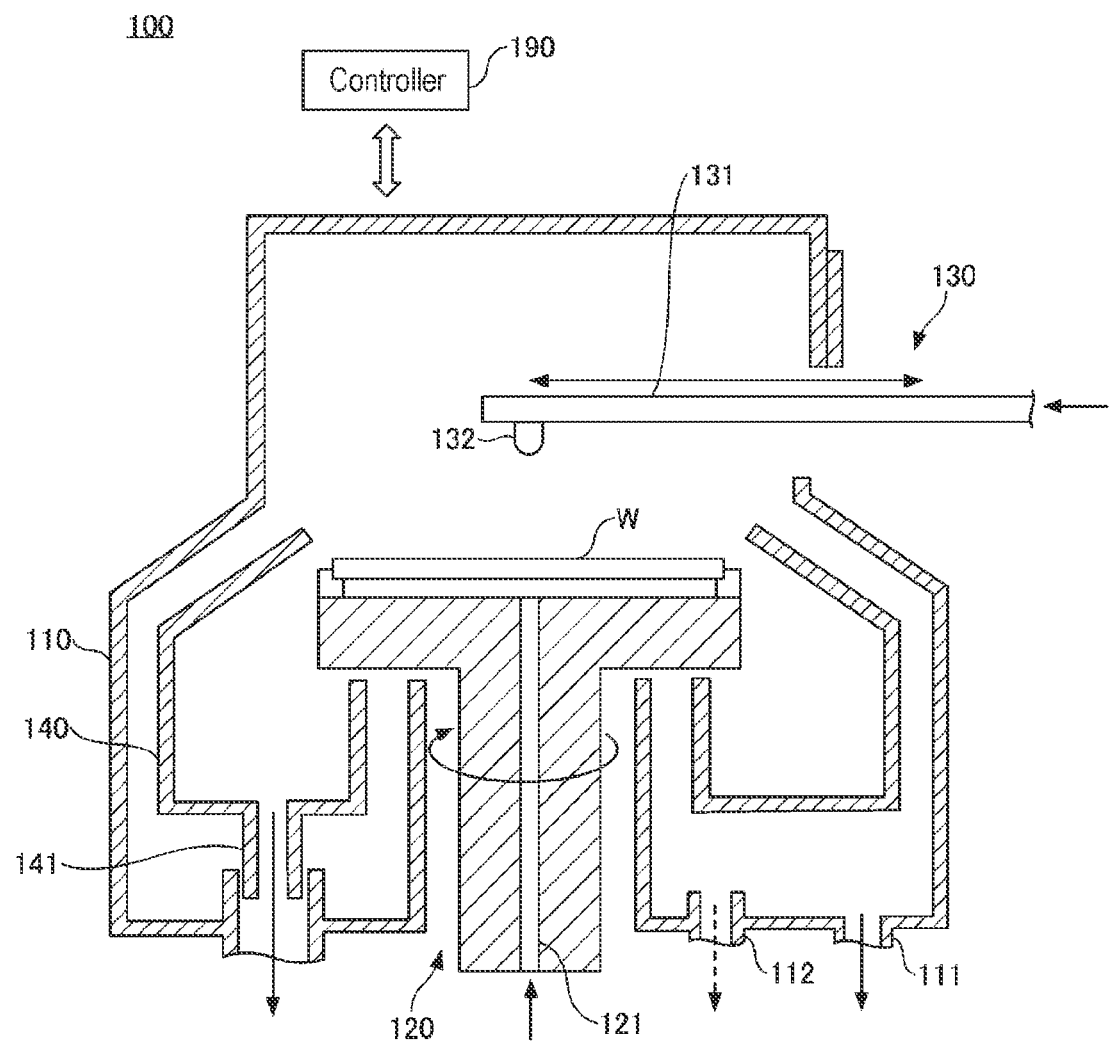
FIG. 3 is a schematic diagram illustrating an example of a cleaning device.

A cleaning device 100 capable of performing the cleaning step S10 of the substrate processing method according to the embodiment will be described with reference to FIG. 3.

The cleaning device 100 is a single wafer type device that cleans the substrates W sheet by sheet by, for example, spin cleaning. The cleaning device 100 includes a chamber 110, a holder 120, a liquid ejector 130, a liquid receiver 140, and a controller 190.

The chamber 110 defines a processing space. A liquid discharge port 111 and a gas discharge port 112 are formed in a bottom of the chamber 110. The liquid discharge port 111 discharges a chemical liquid and a rinsing liquid in the chamber 110. The gas discharge port 112 evacuates an interior of the chamber 110.

The holder 120 is disposed in the chamber 110. The holder 120 holds the substrate W substantially horizontally and rotates the substrate W by rotating around a vertical axis thereof. A chemical liquid supply path 121 is formed in the holder 120. The chemical liquid supply path 121 supplies the chemical liquid and the rinsing liquid to a back surface of the substrate W held by the holder 120. Thus, a cleaning processing is performed on the back surface of the substrate W.

The liquid ejector 130 includes an arm 131 and a nozzle 132. The arm 131 is configured to be able to enter above the rotating substrate W. The nozzle 132 is provided at a distal end of the arm 131. The nozzle 132 is configured to be able to discharge the chemical liquid and the rinsing liquid. The liquid ejector 130 causes the arm 131 to enter above the rotating substrate W, and supplies the chemical liquid and the rinsing liquid from the nozzle 132 in a predetermined order. Thus, a cleaning processing for a front surface of the substrate W is performed. The cleaning processing includes, for example, performing removal of particles or organic contaminants with an SC solution, rinse cleaning with DIW, removal of a native oxide film with a DHF, and rinse cleaning with DIW in this order. However, the cleaning processing is not limited thereto.

The liquid receiver 140 receives the chemical liquid and the rinsing liquid that flows down or is shaken off from the substrate W, and discharges them via a liquid discharge port 141.

The controller 190 processes computer-executable instructions to cause the cleaning device 100 to perform the cleaning step S10. The controller 190 may be configured to control respective components of the cleaning device 100 so as to perform the cleaning step S10. The controller 190 includes, for example, a computer. The computer includes, for example, a CPU, a storage, and a communication interface.

[Coating Device]

Figure 4:
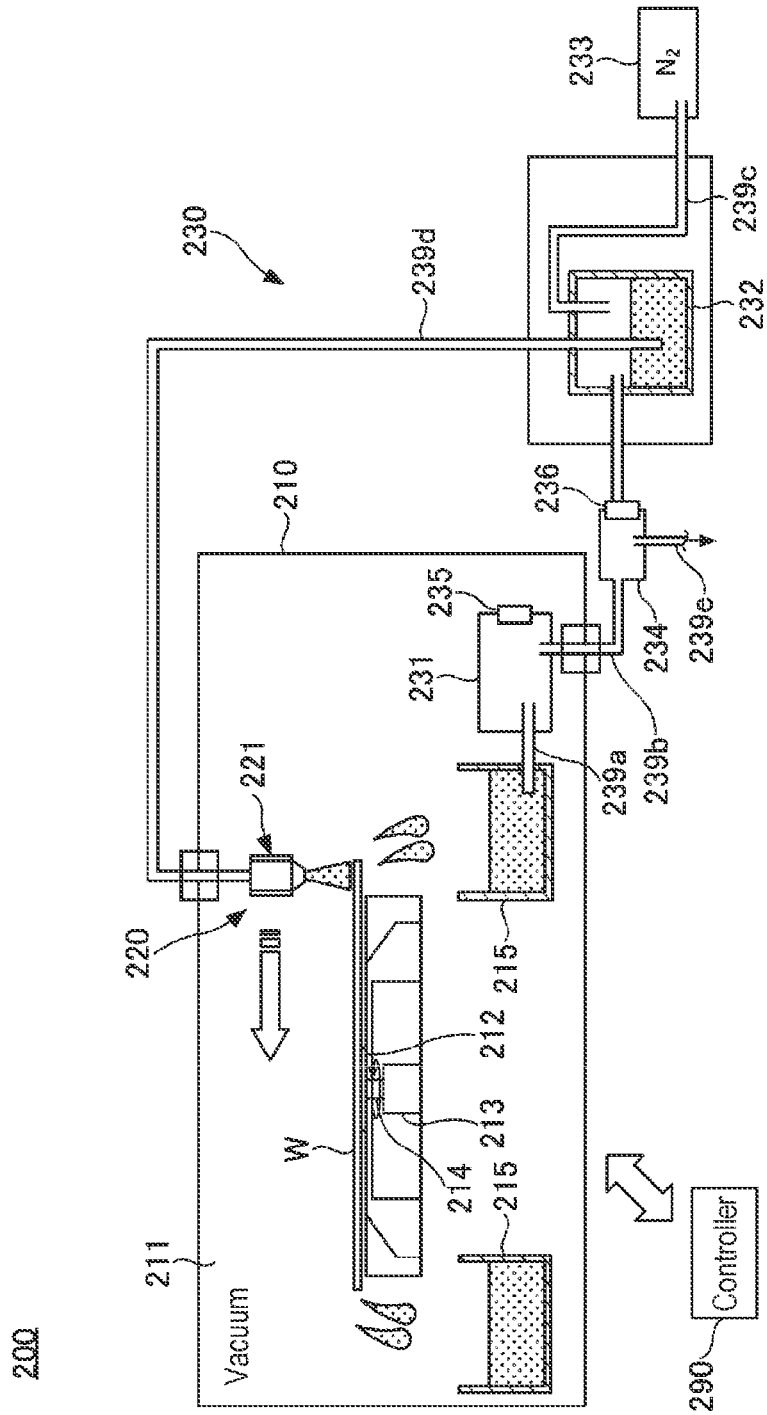
FIG. 4 is a schematic diagram illustrating an example of a coating device.

A vacuum slit coater 200, which is an example of a coating device capable of performing the ionic liquid coating step S20 of the substrate processing method according to the embodiment, will be described with reference to FIG. 4.

The vacuum slit coater 200 includes a chamber 210, a liquid supply 220, a liquid circulator 230, and a controller 290.

The chamber 210 defines a hermetically sealed processing space 211 in which the substrate W is accommodated. A stage 212 is provided in the chamber 210. The stage 212 holds the substrate W in a substantially horizontal state. The stage 212 is connected to an upper end of a rotary shaft 214 which is rotated by a drive mechanism 213, and thus, is rotatably configured. A liquid receiver 215 having an open top is provided around a bottom of the stage 212. The liquid receiver 215 receives and stores the ionic liquid that flows down or is shaken off from the substrate W. An interior of the chamber 210 is evacuated by an evacuation system (not illustrated) including a pressure control valve, a vacuum pump, and the like.

The liquid supply 220 includes a slit nozzle 221. The slit nozzle 221 moves above the substrate W horizontally to supply an anti-drying ionic liquid from the liquid circulator 230 to the surface of the substrate W mounted on the stage 212.

The liquid circulator 230 collects the ionic liquid stored in the liquid receiver 215, and supplies it to the slit nozzle 221. The liquid circulator 230 includes a compressor 231, an undiluted liquid tank 232, a carrier gas source 233, a cleaner 234, and pH sensors 235 and 236.

The compressor 231 is connected to the liquid receiver 215 via a pipe 239a, and collects the ionic liquid stored in the liquid receiver 215 and compresses it to, for example, atmospheric pressure or higher. The compressor 231 is connected to the undiluted liquid tank 232 via a pipe 239b, and transfers the compressed ionic liquid to the undiluted liquid tank 232 via the pipe 239b. For example, a valve and a flowrate controller (both not illustrated) are interposed in the pipe 239a. The ionic liquid is periodically transferred from the compressor 231 to the undiluted liquid tank 232 by, for example, controlling opening and closing of the valve.

The undiluted liquid tank 232 stores the ionic liquid. One end of each of the pipes 239b to 239d is inserted into the undiluted liquid tank 232. The other end of the pipe 239b is connected to the compressor 231, so that the ionic liquid compressed by the compressor 231 is supplied to the undiluted liquid tank 232 via the pipe 239b. The other end of the pipe 239c is connected to the carrier gas source 233, so that a carrier gas such as nitrogen ($N_2$) gas is supplied from the carrier gas source 233 to the undiluted liquid tank 232 via the pipe 239c. The other end of the pipe 239d is connected to the slit nozzle 221, so that the ionic liquid in the undiluted liquid tank 232 is transferred together with the carrier gas to the slit nozzle 221 via the pipe 239d. For example, a valve and a flowrate controller (both not illustrated) are interposed in each of the pipes 239b to 239d.

The carrier gas source 233 is connected to the undiluted liquid tank 232 via the pipe 239c, so that the carrier gas such as nitrogen ($N_2$) gas is supplied to the undiluted liquid tank 232 via the pipe 239c.

The cleaner 234 is interposed in the pipe 239b. The cleaner 234 cleans the ionic liquid transferred from the compressor 231. A drain pipe 239e is connected to the cleaner 234, so that the ionic liquid deteriorating in properties is discharged via the drain pipe 239e. For example, the cleaner 234 controls whether to reuse or discharge the ionic liquid based on a detected value of the pH sensor 236. Further, for example, the cleaner 234 may control whether to reuse or discharge the ionic liquid based on a detected value of the pH sensor 235. Further, for example, the cleaner 234 may control whether to reuse or discharge the ionic liquid based on the detected values of the pH sensor 235 and the pH sensor 236.

The pH sensor 235 is provided in the compressor 231 and detects a hydrogen ion index (pH) of the ionic liquid in the compressor 231.

The pH sensor 236 is provided in the cleaner 234 and detects a hydrogen ion index (pH) of the ionic liquid in the cleaner 234.

The controller 290 processes computer-executable instructions to cause the vacuum slit coater 200 to perform the ionic liquid coating step S20. The controller 290 may be configured to control respective components of the vacuum slit coater 200 so as to perform the ionic liquid coating step S20. The controller 290 includes, for example, a computer. The computer includes, for example, a CPU, a storage, and a communication interface.

[Supercritical Processing Device]

Figure 5:
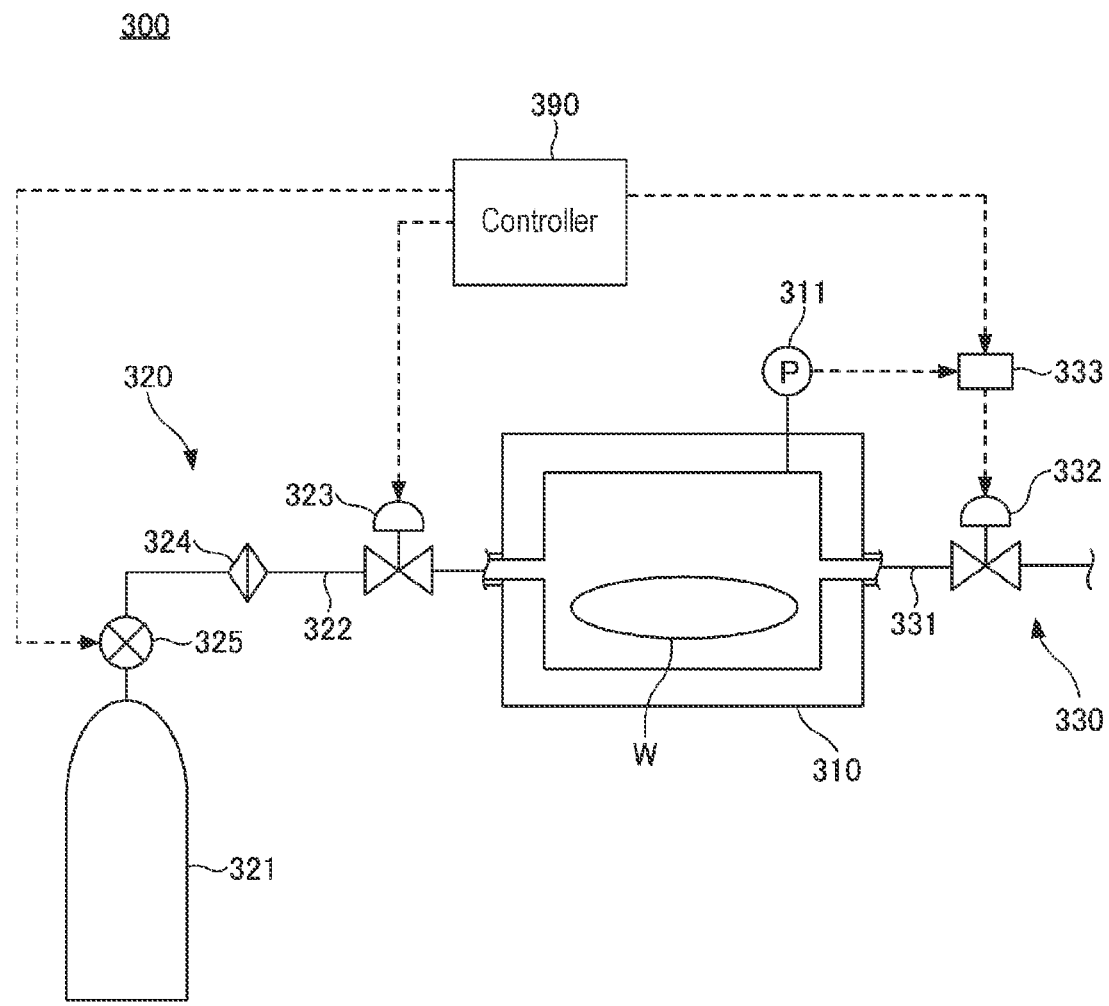
FIG. 5 is a schematic diagram illustrating an example of a supercritical processing device.

A supercritical processing device 300, which is an example of a drying device capable of performing the drying step S30 of the substrate processing method according to the embodiment, will be described with reference to FIG. 5.

The supercritical processing device 300 is a device in which a processing of removing an ionic liquid which is an anti-drying liquid adhered to the surface of the substrate W is performed.

The supercritical processing device 300 includes a processing container 310, a fluid supply 320, a discharger 330, and a controller 390.

The processing container 310 defines a processing space capable of accommodating the substrate W having a diameter of 300 mm, for example. A pressure gauge 311 is provided in the processing container 310. The pressure gauge 311 detects an internal pressure of the processing container 310 and outputs the detected value to the controller 390.

The fluid supply 320 includes a fluid source 321, a fluid supply line 322, an on/off valve 323, a filter 324, and a flowrate adjustment valve 325.

The fluid source 321 includes, for example, a $CO_2$ cylinder that stores liquid $CO_2$ and a booster pump, such as a syringe pump or a diaphragm pump, for raising a pressure of the liquid $CO_2$ supplied from the $CO_2$ cylinder to cause the liquid $CO_2$ to enter a supercritical state. In FIG. 5, the $CO_2$ cylinder and the booster pump are collectively represented in a cylinder shape.

The fluid supply line 322 connects the fluid source 321 to the processing container 310. The fluid supply line 322 supplies the supercritical $CO_2$, which is a high-pressure fluid, from the fluid source 321 to the processing container 310.

The on/off valve 323, the filter 324, and the flowrate adjustment valve 325 are interposed in the fluid supply line 322. The on/off valve 323 is opened and closed according to a supply and stop of the supercritical $CO_2$ to the processing container 310. The filter 324 removes impurities contained in the supercritical $CO_2$ flowing through the fluid supply line 322. The flowrate adjustment valve 325 adjusts a flow rate of the supercritical $CO_2$ flowing through the fluid supply line 322. The flow rate of the supercritical $CO_2$ supplied from the fluid source 321 is adjusted by the flowrate adjustment valve 325, and then the supercritical $CO_2$ is supplied to the processing container 310. The flowrate adjustment valve 325 is configured with, for example, a needle valve or the like, and functions also as an interrupter that interrupts the supply of the supercritical $CO_2$ from the fluid source 321.

The discharger 330 includes a discharge line 331, a pressure reducing valve 332, and a pressure controller 333. The discharge line 331 is connected to a sidewall of the processing container 310. The discharge line 331 discharges the fluid inside the processing container 310. The pressure controller 333 is connected to the pressure reducing valve 332. The pressure controller 333 adjusts an open degree of the pressure reducing valve 332 based on a measured value of a pressure in the processing container 310, which is acquired from the pressure gauge 311 provided in the processing container 310, and a predetermined pressure setting value.

The controller 390 processes computer-executable instructions to cause the supercritical processing device 300 to perform the drying step S30. The controller 390 may be configured to control respective components of the supercritical processing device 300 so as to perform the drying step S30. The controller 390 includes, for example, a computer. The computer includes, for example, a CPU, a storage, and a communication interface.

[Substrate Processing System]

Figure 6:
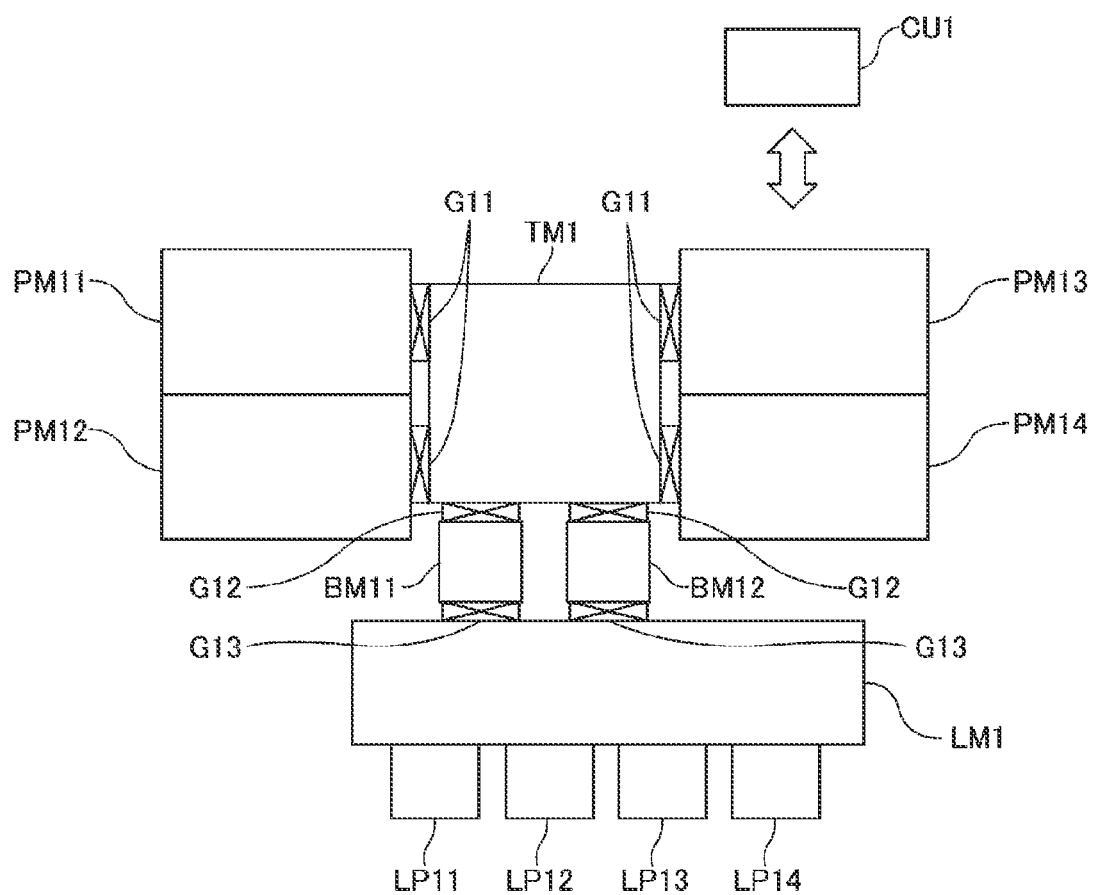
FIG. 6 is a schematic diagram illustrating one example of a substrate processing system.

An example of a substrate processing system capable of performing the substrate processing method according to the embodiment will be described with reference to FIG. 6. As illustrated in FIG. 6, a substrate processing system PS1 is configured as an atmospheric apparatus.

The substrate processing system PS1 includes an atmospheric transfer module TM1, process modules PM11 to PM14, buffer modules BM11 and BM12, a loader module LM1, and the like.

The atmospheric transfer module TM1 has a substantially rectangular shape in a plan view. The atmospheric transfer module TM1 is connected at two opposite side surfaces thereof to the process modules PM11 to PM14. The buffer modules BM11 and BM12 are connected to one side surface of the other two opposite side surfaces of the atmospheric transfer module TM1. The atmospheric transfer module TM1 has a transfer chamber under an inert gas environment, and a transfer robot (not illustrated) is disposed therein. The transfer robot is configured to be pivotable, extendable/retractable, and movable up and down. The transfer robot transfers the substrate W based on operation instructions output by a controller CU1 to be described later. For example, the transfer robot holds the substrate W with a fork disposed at a distal end thereof, and transfers the substrate W between the buffer modules BM11 and BM12 and the process modules PM11 to PM14. In addition, the fork is also called a pick or an end effector.

Each of the process modules PM11 to PM14 has a processing chamber and a stage (not illustrated) disposed therein. The process modules PM11 to PM14 include the cleaning device 100 and the supercritical processing device 300 described above. The process modules PM11 to PM14 may include devices other than the cleaning device 100 and the supercritical processing device 300. The atmospheric transfer module TM1 and the process modules PM11 to PM14 are partitioned by gate valves G11 that may be opened and closed.

The buffer modules BM11 and BM12 are arranged between the atmospheric transfer module TM1 and the loader module LM1. Each of the buffer modules BM11 and BM12 has a stage disposed therein. The substrate W is transferred between the atmospheric transfer module TM1 and the loader module LM1 via the buffer modules BM11 and BM12. The buffer modules BM11 and BM12 and the atmospheric transfer module TM1 are partitioned by gate valves G12 that may be opened and closed. The buffer modules BM11 and BM12 and the loader module LM1 are partitioned by gate valves G13 that may be opened and closed.

The loader module LM1 is arranged opposite to the atmospheric transfer module TM1. The loader module LM1 is, for example, an equipment front end module (EFEM). The loader module LM1 has a rectangular parallelepiped shape, includes a fan filter unit (FFU), and is an atmospheric transfer chamber maintained under an atmospheric pressure environment. The two buffer modules BM11 and BM12 are connected to one longitudinal side surface of the loader module LM1. Load ports LP11 to LP14 are connected to the other longitudinal side surface of the loader module LM1. A container (not illustrated) that accommodates a plurality (for example, twenty-five sheets) of substrates W thereon is mounted on each of the load ports LP11 to LP14. The container is, for example, a front-opening unified pod (FOUP). A transfer robot (not illustrated) that transfers the substrate W is disposed in the loader module LM1. The transfer robot is configured to be movable along a longitudinal direction of the loader module LM1, and to be pivotable, extendable/retractable, and movable up and down. The transfer robot transfers the substrate W based on operation instructions output by the controller CU1. For example, the transfer robot holds the substrate W with a fork disposed at a distal end thereof, and transfers the substrate W between the load ports LP11 to LP14 and the buffer modules BM11 and BM12.

The substrate processing system PS1 is provided with the controller CU1. The controller CU1 may be, for example, a computer. The controller CU1 includes a central processing unit (CPU), a random access memory (RAM), a read only memory (ROM), an auxiliary storage device, and the like. The CPU operates based on programs stored in the ROM or the auxiliary storage device to control respective components of the substrate processing system PS1.

Figure 7:
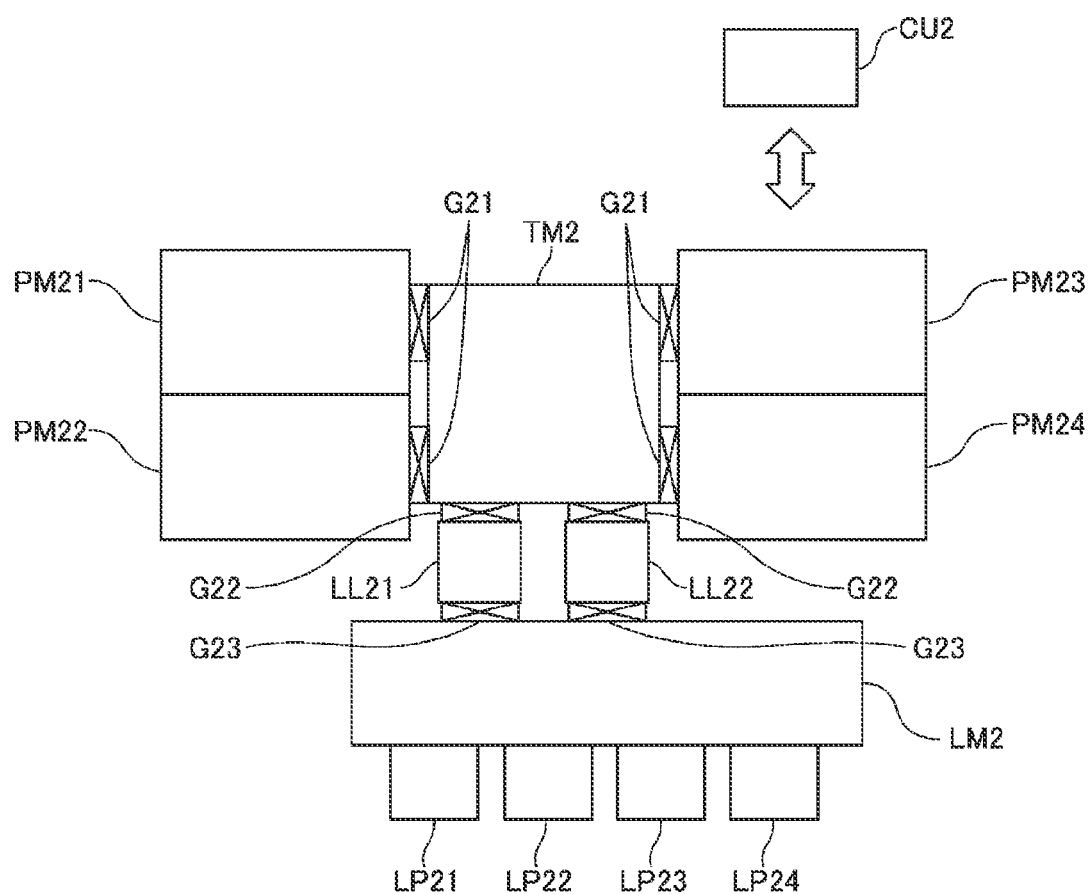
FIG. 7 is a schematic diagram illustrating another example of the substrate processing system.

Another example of a substrate processing system capable of performing the substrate processing method according to the embodiment will be described with reference to FIG. 7. As illustrated in FIG. 7, a substrate processing system PS2 is configured as a vacuum apparatus.

The substrate processing system PS2 includes a vacuum transfer module TM2, process modules PM21 to PM24, load lock modules LL21 and LL22, a loader module LM2, and the like.

The vacuum transfer module TM2 has a substantially rectangular shape in a plan view. The vacuum transfer module TM2 is connected at two opposite side surfaces thereof to the process modules PM21 to PM24. The load lock modules LL21 and LL22 are connected to one side surface of the other two opposite side surfaces of the vacuum transfer module TM2. The vacuum transfer module TM2 has a vacuum chamber under a vacuum environment, and a transfer robot (not illustrated) is disposed therein. The transfer robot is configured to be pivotable, extendable/retractable, and movable up and down. The transfer robot transfers the substrate W based on operation instructions output by a controller CU2 to be described later. For example, the transfer robot holds the substrate W with a fork disposed at a distal end thereof, and transfers the substrate W between the load lock modules LL21 and LL22 and the process modules PM21 to PM24.

Each of the process modules PM21 to PM24 has a processing chamber and a stage (not illustrated) disposed therein. Each of the process modules PM21 to PM24 includes the vacuum slit coater 200 described above. The process modules PM21 to PM24 may include devices other than the vacuum slit coater 200. The vacuum transfer module TM2 and the process modules PM21 to PM24 are partitioned by gate valves G21 that may be opened and closed.

The load lock modules LL21 and LL22 are arranged between the vacuum transfer module TM2 and the loader module LM2. Each of the load lock modules LL21 and LL22 has an internal pressure variable chamber, an interior of which is switchable between vacuum and atmospheric pressure. Each of the load lock modules LL21 and LL22 has a stage (not illustrated) disposed therein. When loading the substrate W from the loader module LM2 to the vacuum transfer module TM2, the load lock modules LL21 and LL22 receive the substrate W from the loader module LM2 while maintaining the interior thereof at atmospheric pressure, and loads the substrate W to the vacuum transfer module TM2 while lowering the internal pressure thereof. When unloading the substrate W from the vacuum transfer module TM2 to the loader module LM2, the load lock modules LL21 and LL22 receive the substrate W from the vacuum transfer module TM2 while maintaining the interior thereof in the vacuum, and unloads the substrate W to the loader module LM2 while raising the internal pressure thereof. The load lock modules LL21 and LL22 and the vacuum transfer module TM2 are partitioned by gate valves G22 that may be opened and closed. The load lock modules LL21 and LL22 and the loader module LM2 are partitioned by gate valves G23 that may be opened and closed.

The loader module LM2 is arranged opposite to the vacuum transfer module TM2. The loader module LM2 is, for example, an EFEM. The loader module LM2 has a rectangular parallelepiped shape, includes an FFU, and is an atmospheric transfer chamber maintained under an atmospheric pressure environment. Two load lock modules LL21 and LL22 are connected to one longitudinal side surface of the loader module LM2. Load ports LP21 to LP24 are connected to the other longitudinal side surface of the loader module LM2. A container (not illustrated) that accommodates a plurality (for example, twenty-five sheets) of substrates W thereon is mounted on each of the load ports LP21 to LP24. The container is, for example, an FOUP. A transfer robot (not illustrated) that transfers the substrate W is disposed in the loader module LM2. The transfer robot is configured to be movable along a longitudinal direction of the loader module LM2, and to be pivotable, extendable/retractable, and movable up and down. The transfer robot transfers the substrate W based on operation instructions output by the controller CU2. For example, the transfer robot holds the substrate W with a fork disposed at a distal end thereof, and transfers the substrate W between the load ports LP21 to LP24 and the load lock modules LL21 and LL22.

The substrate processing system PS2 is provided with the controller CU2. The controller CU2 may be, for example, a computer. The controller CU2 includes a CPU, a RAM, a ROM, an auxiliary storage device, and the like. The CPU operates based on programs stored in the ROM or the auxiliary storage device to control respective components of the substrate processing system PS2.

[Analysis Results]

Results of analyzing the surface tension of the ionic liquid by simulation will be described with reference to FIGS. 8 to 10. In the simulation, the surface tension at 25 degrees C. was calculated for ionic liquids A1, A2, B1, and B2. Further, the surface tension at 100 degrees C. was also calculated for the ionic liquids A2 and B2.

Figure 8:
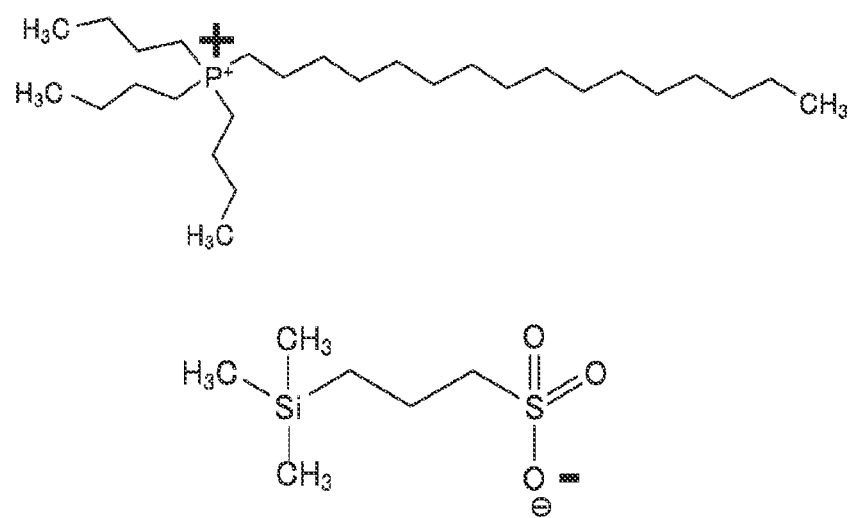
FIG. 8 is an explanatory diagram (1) of an ionic liquid.
Figure 9:
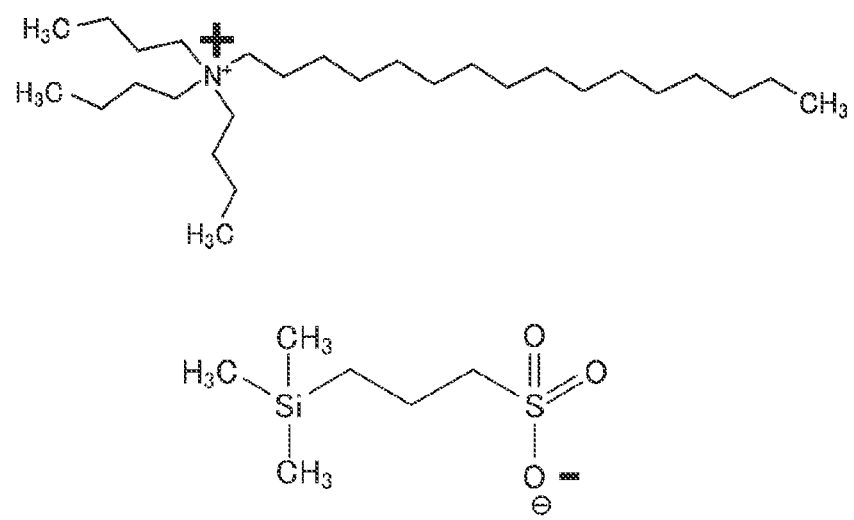
FIG. 9 is an explanatory diagram (2) of an ionic liquid.

An ionic liquid A1 is an ionic liquid represented by the chemical formula of FIG. 8, and is BHDP-DSS. An ionic liquid A2 is an ionic liquid in which all hydrogen atoms in a hydrocarbon chain of the ionic liquid A1 are substituted with fluorine atoms. An ionic liquid B1 is an ionic liquid represented by the chemical formula of FIG. 9, and is BHDA-DSS. An ionic liquid B2 is an ionic liquid in which all hydrogen atoms in a hydrocarbon chain of the ionic liquid B1 are substituted with fluorine atoms.

FIG. 10 is a diagram illustrating results of calculating surface tensions of the ionic liquids by simulation. As illustrated in FIG. 10, the surface tension of the ionic liquid A1 at 25 degrees C. was 29 mN/m, the surface tension of the ionic liquid A2 at 25 degrees C. was 22 mN/m, and the surface tension of the ionic liquid A2 at 100 degrees C. was 15 mN/m. From these results, it can be recognized that the surface tension of the ionic liquid can be reduced by substituting hydrogen atoms in the hydrocarbon chain of the ionic liquid BHDP-DSS with fluorine atoms. Further, it can be recognized that the surface tension of the ionic liquid may be further reduced by substituting hydrogen atoms in the hydrocarbon chain of the ionic liquid BHDP-DSS with fluorine atoms and raising a temperature of the ionic liquid. In addition, a surface tension of IPA at 25 degrees C. is in the order of 20 mN/m.

In addition, as illustrated in FIG. 10, the surface tension of the ionic liquid B1 at 25 degrees C. was 39 mN/m, the surface tension of the ionic liquid B2 at 25 degrees C. was 19 mN/m, and the surface tension of the ionic liquid B2 at 100 degrees C. was 17.5 mN/m. From these results, it can be recognized that the surface tension of the ionic liquid may be reduced by substituting hydrogen atoms in the hydrocarbon chain of BHDA-DSS with fluorine atoms. In addition, it was shown that the surface tension of the ionic liquid may be further reduced by substituting hydrogen atoms in the hydrocarbon chain of BHDA-DSS with fluorine atoms and raising a temperature of the ionic liquid.

According to the present disclosure in some embodiments, it is possible to prevent pattern collapse.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method comprising:
   forming a film of an ionic liquid on a surface of a substrate, on which a pattern is formed, by supplying the ionic liquid to the surface of the substrate; and
   removing the film of the ionic liquid formed on the surface of the substrate,
   wherein the ionic liquid has a cation containing a hydrocarbon chain having six or more carbon atoms,
   wherein at least one hydrogen atom in the hydrocarbon chain is substituted with a fluorine atom, and
   wherein the removing the film of the ionic liquid includes performing a supercritical processing on the substrate having the film of the ionic liquid formed on the substrate.

2. The substrate processing method of claim 1, wherein the hydrocarbon chain contains a carbon atom located at a distal end of the hydrocarbon chain, and all hydrogen atoms bonded to the carbon atom located at the distal end are substituted with fluorine atoms.

3. The substrate processing method of claim 2, wherein the hydrocarbon chain contains a carbon atom located at a proximal end of the hydrocarbon chain, and all hydrogen atoms bonded to the carbon atom located at the proximal end are substituted with fluorine atoms.

4. The substrate processing method of claim 3, wherein all hydrogen atoms in the hydrocarbon chain are substituted with fluorine atoms.

5. The substrate processing method of claim 4, wherein a central element of the cation is nitrogen (N), phosphorus (P), aluminum (Al), or gallium (Ga).

6. The substrate processing method of claim 5, wherein a surface tension of the ionic liquid at 25 degrees C. is 30 mN/m or less.

7. The substrate processing method of claim 1, wherein the hydrocarbon chain contains a carbon atom located at a proximal end of the hydrocarbon chain, and all hydrogen atoms bonded to the carbon atom located at the proximal end are substituted with fluorine atoms.

8. The substrate processing method of claim 1, wherein all hydrogen atoms in the hydrocarbon chain are substituted with fluorine atoms.

9. The substrate processing method of claim 1, wherein a central element of the cation is nitrogen (N), phosphorus (P), aluminum (Al), or gallium (Ga).

10. The substrate processing method of claim 1, wherein a surface tension of the ionic liquid at 25 degrees C. is 30 mN/m or less.

11. The substrate processing method of claim 1, wherein the ionic liquid is BHDP(tributyl(hexadecyl)phosphonium)-DSS(2,2-dimethyl-2-silapentane-5-sulfonate) in which at least one hydrogen atom in a hydrocarbon chain is substituted with a fluorine atom.

12. A substrate processing method comprising:
    forming a film of an ionic liquid on a surface of a substrate, on which a pattern is formed, by supplying the ionic liquid to the surface of the substrate,
    wherein the ionic liquid has a cation containing a hydrocarbon chain having six or more carbon atoms,
    wherein at least one hydrogen atom in the hydrocarbon chain is substituted with a fluorine atom, and
    wherein a surface tension of the ionic liquid at 25 degrees C. is 30 mN/m or less.

13. The substrate processing method of claim 12, wherein the hydrocarbon chain contains a carbon atom located at a distal end of the hydrocarbon chain, and all hydrogen atoms bonded to the carbon atom located at the distal end are substituted with fluorine atoms.

14. The substrate processing method of claim 13, wherein the hydrocarbon chain contains a carbon atom located at a proximal end of the hydrocarbon chain, and all hydrogen atoms bonded to the carbon atom located at the proximal end are substituted with fluorine atoms.

15. The substrate processing method of claim 14, wherein all hydrogen atoms in the hydrocarbon chain are substituted with fluorine atoms.

16. The substrate processing method of claim 15, wherein a central element of the cation is nitrogen (N), phosphorus (P), aluminum (Al), or gallium (Ga).

17. The substrate processing method of claim 16, wherein the ionic liquid is BHDP(tributyl(hexadecyl)phosphonium)-DSS(2,2-dimethyl-2-silapentane-5-sulfonate) in which at least one hydrogen atom in a hydrocarbon chain is substituted with a fluorine atom.

18. The substrate processing method of claim 17, further comprising removing the film of the ionic liquid formed on the surface of the substrate.

* * * * *